(12) United States Patent
Yagi (10) Patent No.: US 8,896,000 B2
(45) Date of Patent: Nov. 25, 2014

(54) LIGHT-EMITTING ELEMENT PACKAGE AND DISPLAY DEVICE

(71) Applicant: Nikon Corporation, Tokyo (JP)

(72) Inventor: Takeshi Yagi, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 13/866,417

(22) Filed: Apr. 19, 2013

(65) Prior Publication Data

US 2013/0228805 A1  Sep. 5, 2013

Related U.S. Application Data

(63) Continuation of application No. PCT/JP2011/075411, filed on Nov. 4, 2011.

(30) Foreign Application Priority Data

Nov. 4, 2010 (JP) .................................. 2010-247700

(51) Int. Cl.
| | | |
|---|---|---|
| H01L 29/20 | (2006.01) | |
| H01L 27/15 | (2006.01) | |
| G09F 9/33 | (2006.01) | |
| G09F 9/302 | (2006.01) | |
| H01L 25/075 | (2006.01) | |

(52) U.S. Cl.
CPC .............. *H01L 27/156* (2013.01); *G09F 9/33* (2013.01); *G09F 9/302* (2013.01); *H01L 25/0753* (2013.01)
USPC 257/89; 257/79; 257/E33.054; 257/E25.032; 438/28; 438/35

(58) Field of Classification Search
USPC ......... 257/79, 89, E33.054, E25.032; 438/28, 438/35
See application file for complete search history.

(56) References Cited

U.S. PATENT DOCUMENTS

| | | | |
|---|---|---|---|
| 6,243,060 B1 | 6/2001 | Natori | |
| 2008/0238839 A1* | 10/2008 | Kim et al. ...................... | 345/83 |
| 2010/0220461 A1 | 9/2010 | Naijo | |
| 2010/0295466 A1 | 11/2010 | Katakame | |

FOREIGN PATENT DOCUMENTS

| | | |
|---|---|---|
| JP | A-8-153895 | 6/1996 |
| JP | A-11-3051 | 1/1999 |
| JP | A-11-149260 | 6/1999 |

(Continued)

OTHER PUBLICATIONS

International Search Report issued in International Application No. PCT/JP2011/075411 on Dec. 6, 2011 (with translation).

(Continued)

*Primary Examiner* — Su Kim
(74) *Attorney, Agent, or Firm* — Oliff PLC (57) ABSTRACT

A light-emitting element package includes plural substrates and plural light-emitting elements disposed on each of the substrates. The light-emitting elements are arranged on each substrate so that an arrangement of the light-emitting elements on each substrate becomes same in an arrangement state in which the substrates are arranged with a regular pitch along a first direction and a second direction which are directions perpendicular to the substrate. The light-emitting elements are arranged on each substrate so that a pitch of the light-emitting elements on each substrate is equal to a pitch of the light-emitting elements between the neighboring substrates in the arrangement state of the substrates.

10 Claims, 8 Drawing Sheets

(56) References Cited

FOREIGN PATENT DOCUMENTS

| JP | A-2001-168396 | 6/2001 |
| JP | A-2001-282142 | 10/2001 |
| JP | A-2002-082635 | 3/2002 |
| JP | A-2005-062731 | 3/2005 |
| JP | A-2008-305940 | 12/2008 |
| JP | A-2009-186745 | 8/2009 |
| WO | WO98/37534 A1 | 8/1998 |
| WO | WO 2008/047862 A1 | 4/2008 |

OTHER PUBLICATIONS

Written Opinion of the International Searching Authority issued in International Application No. PCT/JP2011/075411 on Dec. 6, 2011 (with translation).

Jun. 24, 2014 Notice of Reasons for Rejection issued in Japanese Patent Application No. 2010-247700 (with English translation).

* cited by examiner

LIGHT-EMITTING ELEMENT PACKAGE AND DISPLAY DEVICE

CROSS-REFERENCE TO RELATED APPLICATION

This is a Continuation Application of International Application No. PCT/JP2011/075411, filed Nov. 4, 2011, which claims priority to Japanese Patent Application No. 2010-247700, filed on Nov. 4, 2010. The contents of the aforementioned applications are incorporated herein by reference.

BACKGROUND

1. Field of the Invention

The present invention relates to a light-emitting element package and a display device.

2. Description of Related Art

Regarding a display device, for example, a technique of displaying a color image using plural sub pixels arranged in a matrix is known. In such a display device, a configuration is known in which LEDs of three colors of R (Red), G (Green), and B (Blue) are made to emit light as sub pixels (for example, see PCT International Publication No. WO2008/047862). The display device described in PCT International Publication No. WO2008/047862 includes plural LED packages each having a red LED, a green LED, and a blue LED arranged therein. The plural LED packages are arranged, for example, in a matrix.

Recently, a display device has been known in which plural sub pixels are driven in a time-division manner. In this display device, an independent pixel is formed between two neighboring pixels, for example, partially using the sub pixels of the two pixels. By driving the sub pixels in this way, a display with higher precision can be made.

In a display device performing a time-division driving operation, elements having a high response speed need to be used as the sub pixels. An LED having a high response speed can be suitably used in the display device performing a time-division driving operation. In the display device performing a time-division driving operation, it is necessary to arrange LEDs with a regular pitch in a single pixel and between neighboring pixels.

SUMMARY

However, for example, when the LED packages are used as described in PCT international Publication No. WO2008/047862, the LED pitch in a single LED package is different from the LED pitch between the neighboring LED packages. Accordingly, it is difficult to display a pixel using the LEDs of the neighboring LED packages. In this way, the light-emitting element package such as LEDs has a problem in that high display characteristics are not obtained even when the light-emitting element packages are mounted on a display device performing a time-division driving operation.

An object of an aspect of the present invention is to provide a light-emitting element package and a display device which can obtain high display characteristics even when a time-division driving operation is performed.

According to a first aspect of the present invention, a light-emitting element package is provided, including: a plurality of substrates, and a plurality of light-emitting elements disposed on each of the plurality of substrates, wherein the plurality of light-emitting elements are arranged on each substrate so that an arrangement of the plurality of light-emitting elements on each substrate becomes same in an arrangement state in which the plurality of substrates are arranged with a regular pitch along a first direction and a second direction which are directions perpendicular to a thickness direction of the substrates, and wherein the plurality of light-emitting elements are arranged on each substrate so that a pitch of the plurality of light-emitting elements on each substrate is equal to a pitch of the plurality of light-emitting elements between neighboring substrates in the arrangement state of the substrates.

According to a second aspect of the present invention, a display device is provided, including: a display panel in which a plurality of the light-emitting element packages according to the first aspect are arranged with a regular pitch in the first direction and the second direction, and a controller that displays a pixel by combining some light-emitting elements of each light-emitting element package out of the plurality of light-emitting elements of the neighboring light-emitting element packages.

According to aspects of the present invention, it is possible to obtain high display characteristics even when a time-division driving operation is performed.

DESCRIPTION OF EMBODIMENTS

Hereinafter, embodiments of the present invention will be described with reference to the accompanying drawings.

First Embodiment

Figure 1:
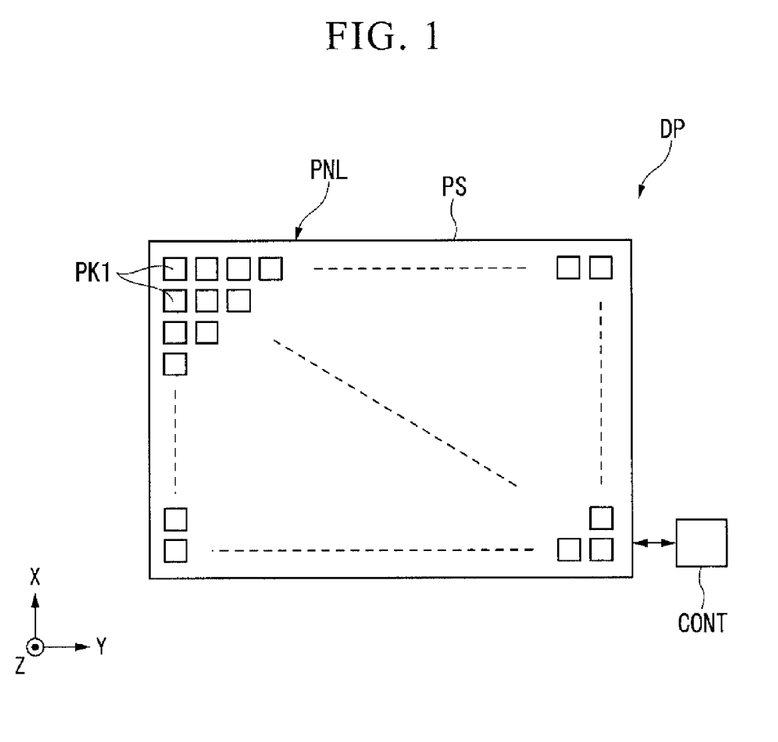
FIG. 1 is a diagram schematically illustrating a configuration of a display device according to a first embodiment of the present invention.

FIG. 1 is a diagram illustrating a configuration of a display device DP according to this embodiment.

As shown in FIG. 1, the display device DP includes a display panel PNL and a controller CONT. The display device DP is configured to display images, characters, or the like on the display panel PNL under the control of the controller CONT.

Figure 2:
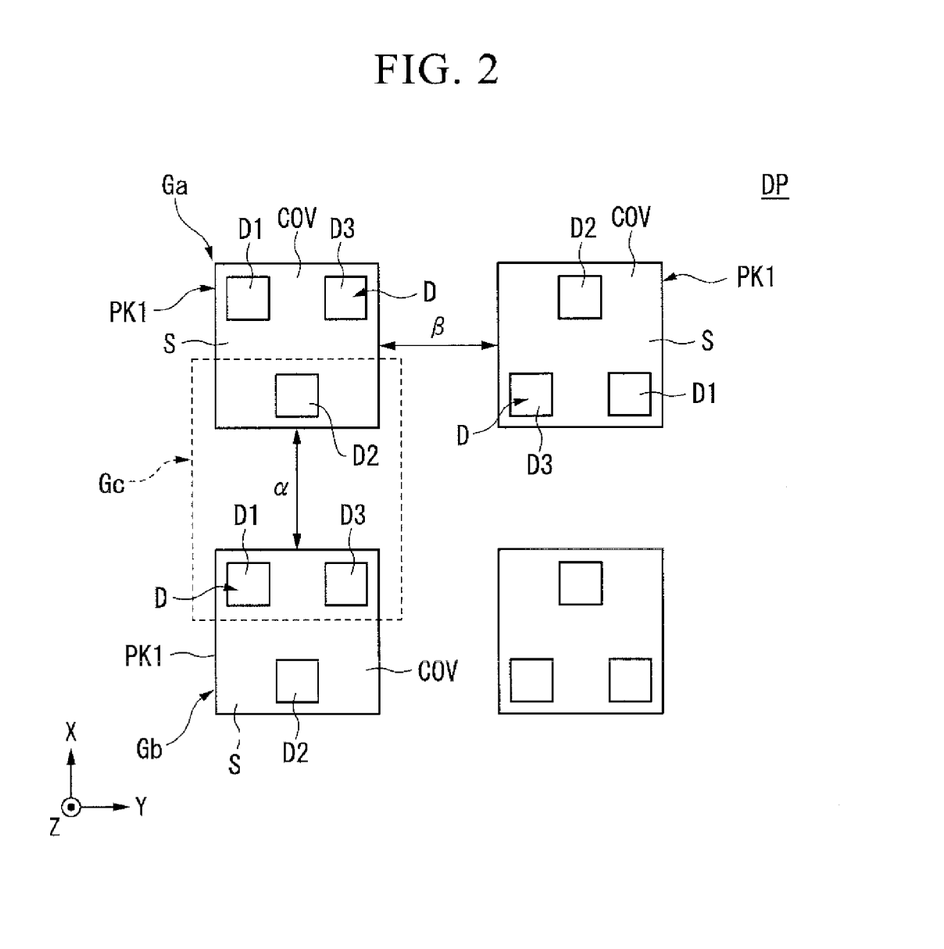
FIG. 2 is a diagram illustrating a partial configuration of the display device according to the first embodiment.

FIG. 2 is a plan view illustrating a partial configuration of the display panel PNL.

As shown in FIGS. 1 and 2, the display panel PNL includes a plate-like member PS and plural light-emitting element packages PM. The plate-like member PS is formed in a rectangular shape and supports the plural light-emitting element packages PK1. Wires, terminals, and the like connected to the plural light-emitting element packages PK1 are formed on the plate-like member PS. The plural light-emitting element packages PK1 are arranged in a matrix on the plate-like member PS.

A driving circuit (not shown) and the like driving the light-emitting element packages PK1 are formed on (the rear surface of) the plate-like member PS. The driving circuit is connected to the controller CONT via a wire (not shown) formed on the plate-like member PS.

Figure 3:
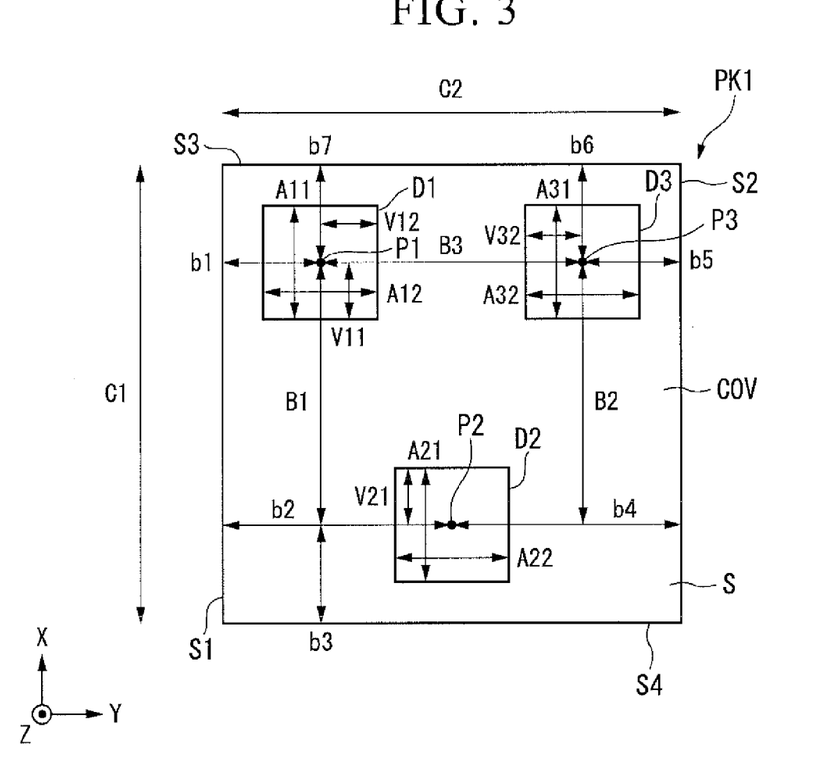
FIG. 3 is a plan view illustrating a configuration of a light-emitting element package according to the first embodiment.
Figure 4:
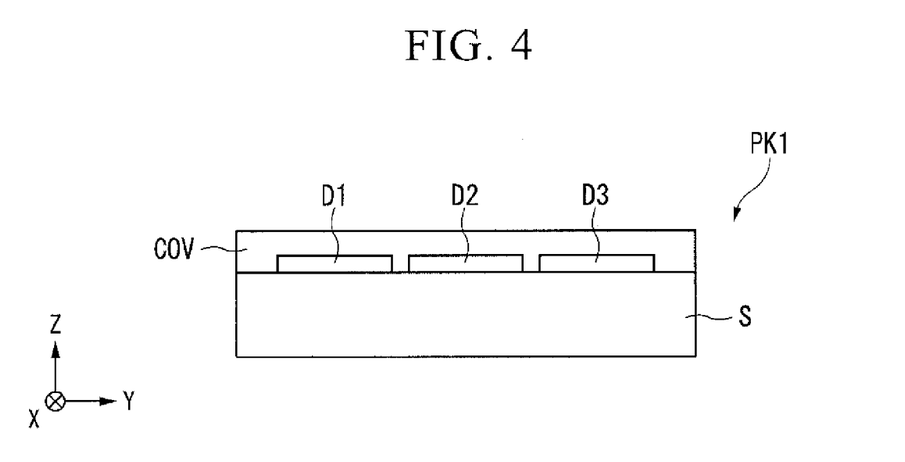
FIG. 4 is a side view illustrating the configuration of the light-emitting element package according to the first embodiment.

FIG. 3 is a plan view illustrating the configuration of a light-emitting element package PK1. FIG. 4 is a side view illustrating the configuration of the light-emitting element package PK1.

As shown in FIGS. 2 to 4, each light-emitting element package PK1 includes a substrate S, plural light-emitting elements D, and a protective member COV.

The substrate S is formed in a rectangular shape. As shown in FIG. 3, the substrates S are arranged in a matrix in the X direction and the Y direction on the plate-like member PS so that a first side S1 and a second side S2 out of four sides of the substrate S are parallel to the X direction and a third side S3 and a fourth side S4 are parallel to the Y direction. Wires, terminals, and the like (not shown) connected to plural light-emitting elements D are formed on the substrate S. In this embodiment, as shown in FIG. 2, the distance between the neighboring substrates S in the X direction is defined as α and the distance between the neighboring substrates S in the Y direction is defined as β.

As shown in FIG. 3, in this embodiment, three light-emitting elements D of a first light-emitting element D1, a second light-emitting element D2, and a third light-emitting element D3 are arranged as the plural light-emitting elements D on a single substrate S. In this embodiment, for example, a red LED is used as the first light-emitting element D1, a green LED is used as the second light-emitting element D2, and a blue LED is used as the third light-emitting element D3.

The first light-emitting element D1 and the third light-emitting element D3 are arranged along the third side S3 out of four sides of the substrate S. The first light-emitting element D1 is disposed to be close to the first side S1 and the third light-emitting element D3 is disposed to be close to the second side S2. The second light-emitting element D2 is disposed at a position along the fourth side S4 and is located at the center position in the Y direction of the fourth side S4. In the substrates S neighboring in the Y direction, the bearings of the substrates S are different from each other by 180°.

In this embodiment, the size of the first light-emitting element D1 in the X direction is defined as A11, the size of the first light-emitting element D1 in the Y direction is defined as A12, the size of the second light-emitting element D2 in the X direction is defined as A21, the size of the second light-emitting element D2 in the Y direction is defined as A22, the size of the third light-emitting element D3 in the X direction is defined as A31, and the size of the third light-emitting element D3 in the Y direction is defined as A32.

The distance between a first emission center P1 which is the center of light emission of the first light-emitting element D1 and a second emission center P2 which is the center of light emission of the second light-emitting element D2 in the X direction is defined as B1, the distance between the second emission center P2 and a third emission center P3 which is the center of light emission of the third light-emitting element D3 in the X direction is defined as B2, and the distance between the third emission center P3 and the first emission center P1 in the Y direction is defined as B3.

The distance between the first emission center P1 and the first side S1 is defined as b1, the distance between the second emission center P2 and the first side S1 is defined as b2, the distance between the second emission center P2 and the fourth side S4 is defined as b3, the distance between the second emission center P2 and the second side S2 is defined as b4, the distance between the third emission center P3 and the second side S2 is defined as b5, the distance between the third emission center P3 and the third side S3 is defined as b6, the distance between the first emission center P1 and the third side S3 is defined as b7, the size in the X direction of the substrate S is defined as C1, and the size in the Y direction of the substrate S is defined as C2.

In this case, when V11+V21<B1 and V12+V32<B3 are satisfied, the first light-emitting element D1, the second light-emitting element D2, and the third light-emitting element D3 are arranged so as to satisfy Expressions 1 and 2.

$$C1 = B1 + b3 + b7 = 2 \times B1 - \alpha \tag{1}$$

$$C2 = B3 + b1 + b5 = 2 \times B3 - \beta \tag{2}$$

In this case, it is preferable that the first light-emitting element D1, the second light-emitting element D2, and the third light-emitting element D3 be arranged so as to satisfy Expression 3.

$$B1 = B2 = (\sqrt{3}/2) \times B3 \tag{3}$$

It is more preferable that the first light-emitting element D1, the second light-emitting element D2, and the third light-emitting element D3 be arranged so as to satisfy Expression 4.

$$C1 = C2 \tag{4}$$

Since the first light-emitting element D1, the second light-emitting element D2, and the third light-emitting element D3 are arranged in this way, the arrangement of the plural light-emitting elements D on each substrate S is the same in the plural substrates S, and the pitch of the plural light-emitting elements D on a single substrate S is equal to the pitch (the pitch of the neighboring light-emitting elements D between the neighboring substrates S, that is, the pitch across the two substrates S) of the plural light-emitting elements D neighboring with a gap between the substrates S.

Next, an operation of the display device DP having the above-mentioned configuration will be described below with reference to FIG. 2. The display device DP according to this embodiment can perform a time-division driving operation. Hereinafter, the operation of the display device DP will be described with the light-emitting element package PK1 on the left-top side in FIG. 2 and the light-emitting element package PK1 on the left-bottom side in the drawing as an example.

As shown in FIG. 2, the controller CONT controls the light-emitting element package PK1 to perform a display as a single pixel using the first light-emitting element D1, the second light-emitting element D2, and the third light-emitting element D3 as sub pixels by turning on or off the light-emitting elements D of the light-emitting element package PK1 on the left-top or left-bottom side of the drawing. For example, a pixel Ga is formed by the light-emitting element package PK1 on the left-top side of the drawing, and a pixel Gb is formed by the light-emitting element package PK1 on the left-bottom side of the drawing.

In this embodiment, by using some sub pixels of the two neighboring pixels Ga and Gb, an independent pixel can be formed between the two pixels Ga and Gb. Specifically, as shown in FIG. 2, an independent pixel Ge is formed by the second light-emitting element D2 of the light-emitting element package PK1 on the left-top side of the drawing and the first light-emitting element D1 and the third light-emitting element D3 of the light-emitting element package PK1 on the left-bottom side of the drawing. By driving the sub pixels in a time-division manner in this way, it is possible to achieve a display with higher precision.

In a display device performing a time-division driving operation, it is necessary to use a light-emitting element having a high response speed as a sub pixel. Accordingly, in the display device DP according to this embodiment, since LEDs having a high response speed are used as the light-emitting elements D, it is possible to suitably perform a time-division driving operation.

In a display device performing a time-division driving operation, it is necessary to arrange the light-emitting elements with a regular pitch in a single pixel and between the neighboring pixels. In this regard, in the display device DP according to this embodiment, the pitch of the plural light-emitting elements D on a single substrate S is equal to the pitch (the pitch of the plural neighboring light-emitting elements D between the neighboring substrates S, that is, the pitch across the two substrates S) of the plural light-emitting elements D neighboring with a gap between the substrates S. Thus, the same degree of display is possible when a pixel is formed in a single light-emitting element package PK1 and when a pixel is formed with the gap between two light-emitting element packages PK1. Therefore, for example, when white is displayed with the configuration shown in FIG. 2, the same degree of display is possible when using both the pixel Ga and the pixel Gb, and when using the pixel Ge. In this way, it is possible to prevent degradation in display characteristics when a pixel is formed with the gap between two light-emitting element packages PK1, thereby obtaining superior display characteristics.

In this embodiment, it is described above that the bearings of the substrates S are different by 180° between the substrates S neighboring in the Y direction, but the bearings of the substrates S may be different from each other by 180° between the substrates S neighboring in the X direction and the like.

Second Embodiment

A second embodiment of the present invention will be described below.

In this embodiment, an example where the number of light-emitting elements D arranged on a substrate of a light-emitting element package is four will be described.

Figure 5:
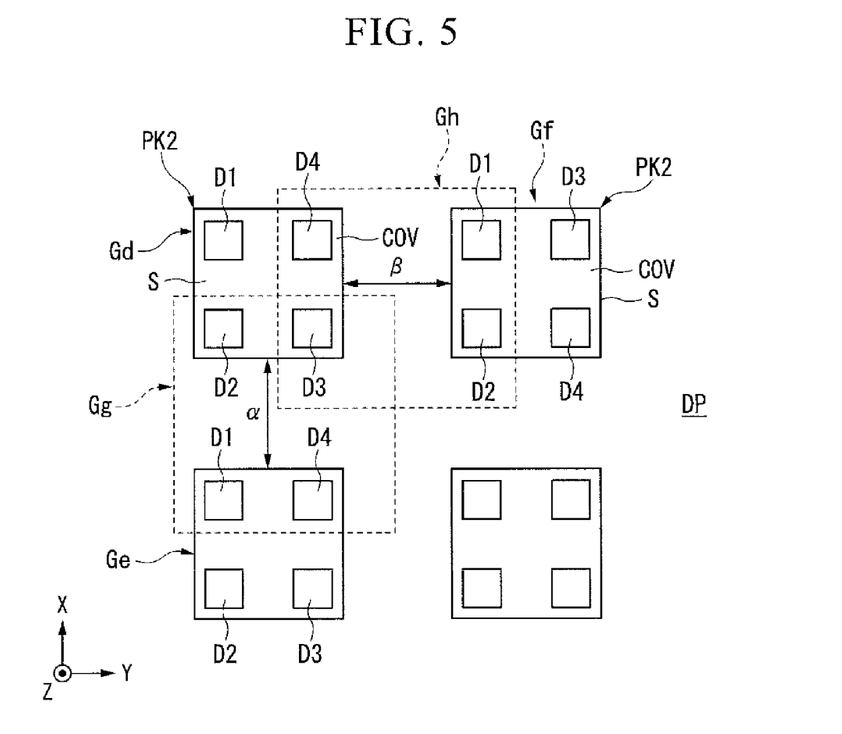
FIG. 5 is a diagram illustrating a partial configuration of a display device according to a second embodiment of the present invention.
Figure 6:
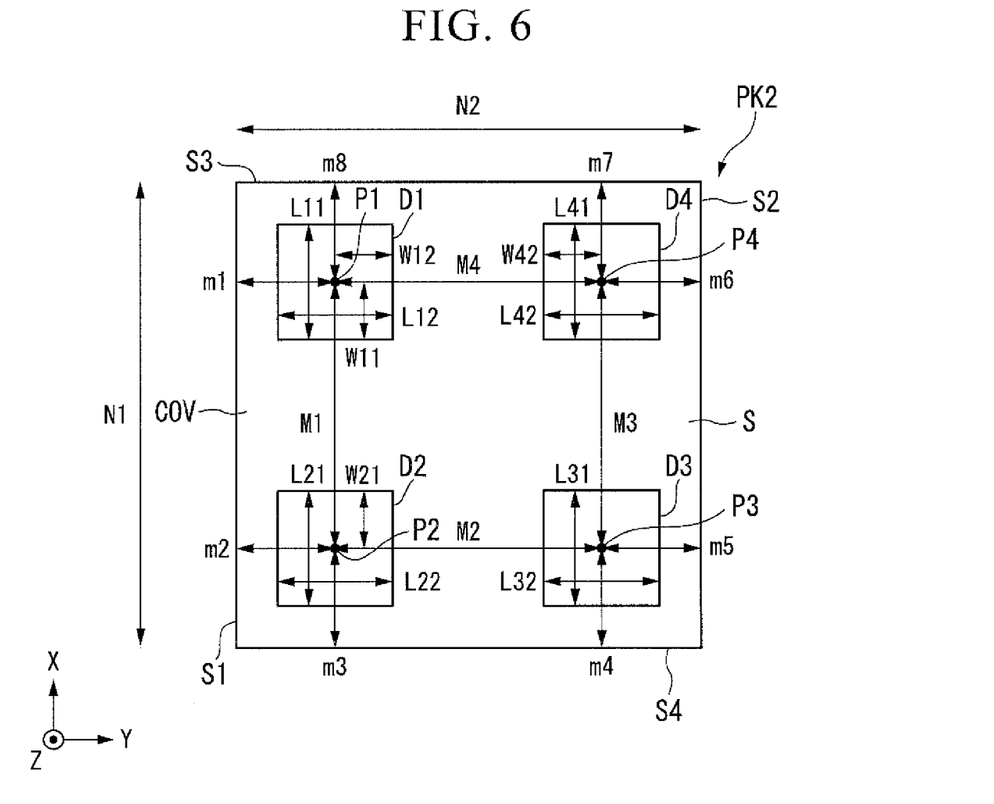
FIG. 6 is a plan view illustrating a configuration of a light-emitting element package according to the second embodiment.
Figure 7:
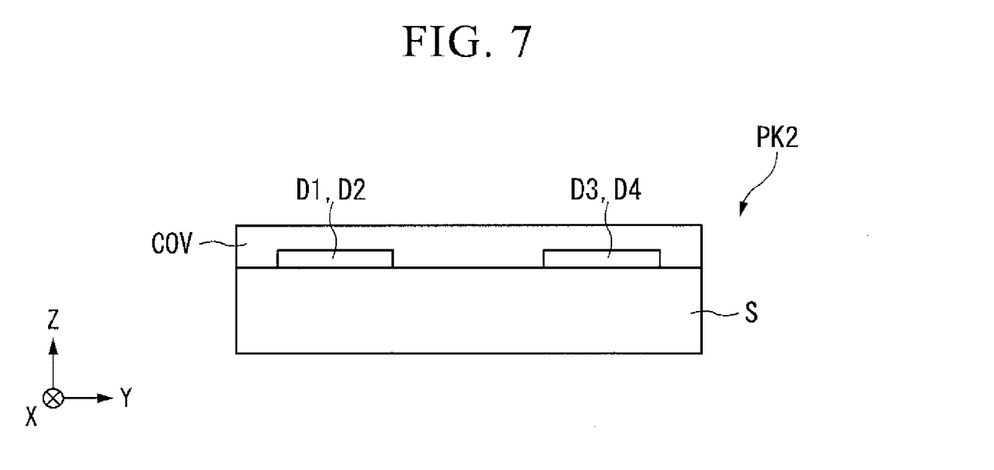
FIG. 7 is a side view illustrating the configuration of the light-emitting element package according to the second embodiment.

FIG. 5 is a plan view illustrating a partial configuration of a display panel PNL. FIG. 6 is a plan view illustrating the configuration of a light-emitting element package PK2. FIG. 7 is a side view illustrating the configuration of the light-emitting element package PK2.

As shown in FIGS. 5 to 7, each light-emitting element package PK2 includes a substrate S, plural light-emitting elements D, and a protective member COV.

The substrate S is formed in a rectangular shape. As shown in FIG. 6, the substrates S are arranged in a matrix in the X direction and the Y direction on the plate-like member PS so that a first side S1 and a second side S2 out of four sides of the substrate S are parallel to the X direction and a third side S3 and a fourth side S4 are parallel to the Y direction. Wires, terminals, and the like (not shown) connected to plural light-emitting elements D are formed on the substrate S. In this embodiment, as shown in FIG. 5, the distance between the neighboring substrates S in the X direction is defined as $\alpha$ and the distance between the neighboring substrates S in the Y direction is defined as $\beta$.

As shown in FIG. 6, in this embodiment, four light-emitting elements D of a first light-emitting element D1, a second light-emitting element D2, a third light-emitting element D3, and a fourth light-emitting element D4 are arranged as the plural light-emitting elements D on a single substrate S. In this embodiment, for example, a red LED is used as the first light-emitting element D1, a green LED is used as the second light-emitting element D2, a blue LED is used as the third light-emitting element D3, and a green LED is used as the fourth light-emitting element D4. An LED emitting light of another color (for example, yellow) such as a white LED may be used as the fourth light-emitting element D4.

The first light-emitting element D1 and the fourth light-emitting element D4 are arranged along the third side S3 of the substrate S. The second light-emitting element D2 and the third light-emitting element D3 are arranged along the fourth side S4. The first light-emitting element D1 and the second light-emitting element D2 are disposed to be close to the first side S1, and the third light-emitting element D3 and the fourth light-emitting element D4 are disposed to be close to the second side S2.

In this embodiment, the size of the first light-emitting element D1 in the X direction is defined as L11, the size of the first light-emitting element D1 in the Y direction is defined as L12, the size of the second light-emitting element D2 in the X direction is defined as L21, the size of the second light-emitting element D2 in the Y direction is defined as L22, the size of the third light-emitting element D3 in the X direction is defined as L31, the size of the third light-emitting element D3 in the Y direction is defined as L32, the size of the fourth light-emitting element D4 in the X direction is defined as L41, and the size of the fourth light-emitting element D4 in the Y direction is defined as L42.

The distance between a first emission center P1 which is the center of light emission of the first light-emitting element D1 and a second emission center P2 which is the center of light emission of the second light-emitting element D2 in the X direction, is defined as M1, the distance between the second emission center P2 and a third emission center P3 which is the center of light emission of the third light-emitting element D3 in the Y direction is defined as M2, the distance between the third emission center P3 and a fourth emission center P4 which is the center of light emission of the fourth light-emitting element D4 in the X direction is defined as M3, and the distance between the fourth emission center P4 and the first emission center P1 in the X direction is defined as M4.

The distance between the first emission center P1 and the first side S1 is defined as m1, the distance between the second emission center P2 and the first side S1 is defined as m2, the distance between the second emission center P2 and the fourth side S4 is defined as m3, the distance between the third emission center P3 and the fourth side S4 is defined as m4, the distance between the third emission center P3 and the second side S2 is defined as m5, the distance between the fourth emission center P4 and the second side S2 is defined as m6, the distance between the fourth emission center P4 and the third side S3 is defined as m7, the distance between the first emission center P1 and the third side S3 is defined as m8, the size in the X direction of the substrate S is defined as N1, and the size in the Y direction of the substrate S is defined as N2.

In this case, when W11+W21<M1 and W12+W42<M4 are satisfied, the first light-emitting element D1, the second light-emitting element D2, the third light-emitting element D3, and the fourth light-emitting element D4 are arranged so as to satisfy Expressions 5 and 6.

$$N1=M1+m3+m8=2\times M1-\alpha \quad (5)$$

$$N2=M4+m1+m6=2\times M4-\beta \quad (6)$$

In this case, it is preferable that the first light-emitting element D1, the second light-emitting element D2, the third light-emitting element D3, and the fourth light-emitting element D4 be arranged so as to satisfy Expression 7.

$$M1=M2=M3=M4 \quad (7)$$

It is more preferable that the first light-emitting element D1, the second light-emitting element D2, the third light-emitting element D3, and the fourth light-emitting element D4 be arranged so as to satisfy Expression 8.

$$N1=N2 \quad (8)$$

Since the first light-emitting element D1, the second light-emitting element D2, the third light-emitting element D3, and the fourth light-emitting element D4 are arranged in this way, the arrangement of the plural light-emitting elements D on each substrate S is the same in the plural substrates S, and the pitch of the plural light-emitting elements D on a single substrate S is equal to the pitch (the pitch of the neighboring light-emitting elements D between the neighboring substrates S, that is, the pitch across the two substrates S) of the plural light-emitting elements D neighboring with a gap between the substrates S.

The operation of the display device DP having the above-mentioned configuration will be described below with reference to FIG. 5. The display device DP according to this embodiment can perform a time-division driving operation. Hereinafter, the operation of the display device DP will be described with the light-emitting element package PK2 on the left-top side in FIG. 5, the light-emitting element package PK2 on the left-bottom side in the drawing, and the light-emitting element package PK2 on the right-top side in the drawing as an example.

As shown in FIG. 5, the controller CONT controls the light-emitting element package PK2 to perform a display as a single pixel using the first light-emitting element D1, the second light-emitting element D2, the third light-emitting element D3, and the fourth light-emitting element D4 as sub pixels by turning on or off the light-emitting elements D of the light-emitting element package PK2 on the left-top side, left-bottom side, or the right-top side of the drawing. For example, a pixel Gd is formed by the light-emitting element package PK2 on the left-top side of the drawing, a pixel Ge is formed by the light-emitting element package PK2 on the left-bottom side of the drawing, and a pixel Gf is formed by the light-emitting element package PK2 on the right-top of the drawing.

In this embodiment, by using some sub pixels of the two neighboring pixels Gd and Ge, an independent pixel can be formed between the two pixels Gd and Ge. Specifically, as shown in FIG. 5, an independent pixel Gg is formed by the second light-emitting element D2 and the third light-emitting element D3 of the light-emitting element package PK2 on the left-top side of the drawing and the first light-emitting element D1 and the fourth light-emitting element D4 of the light-emitting element package PK2 on the left-bottom side of the drawing.

In this embodiment, by using some sub pixels of the two neighboring pixels Gd and Gf, an independent pixel can be formed between the two pixels Gd and Gf. Specifically, as shown in FIG. 5, an independent pixel Gh is formed by the third light-emitting element D3 and the fourth light-emitting element D4 of the light-emitting element package PK2 on the left-top side of the drawing and the first light-emitting element D1 and the second light-emitting element D2 of the light-emitting element package PK2 on the right-top side of the drawing.

As described above, in this embodiment, the pitch of the plural light-emitting elements D on a single substrate S is equal to the pitch (the pitch of the plural neighboring light-emitting elements D between the neighboring substrates S, that is, the pitch across the two substrates S) of the plural light-emitting elements D neighboring with a gap between the substrates S. Accordingly, by performing a time-division driving operation using the plural light-emitting elements D as sub pixels, a display with high precision is possible when a pixel is formed in a single light-emitting element package PK2 and when a pixel is formed with the gap between two neighboring light-emitting element packages PK2. In this way, it is possible to prevent degradation in display characteristics when a pixel is formed with the gap between two light-emitting element packages PK2, thereby obtaining superior display characteristics.

Third Embodiment

A third embodiment of the present invention will be described below.

In this embodiment, the entire configuration of a light-emitting element package PK (PK1 and PK2) including terminals TM will be described. Examples of the entire configuration (the arrangement of the terminals TM) of the light-emitting element package PK include the configurations shown in FIGS. 8A to 10B. Other configurations may be used.

Figure 8A:
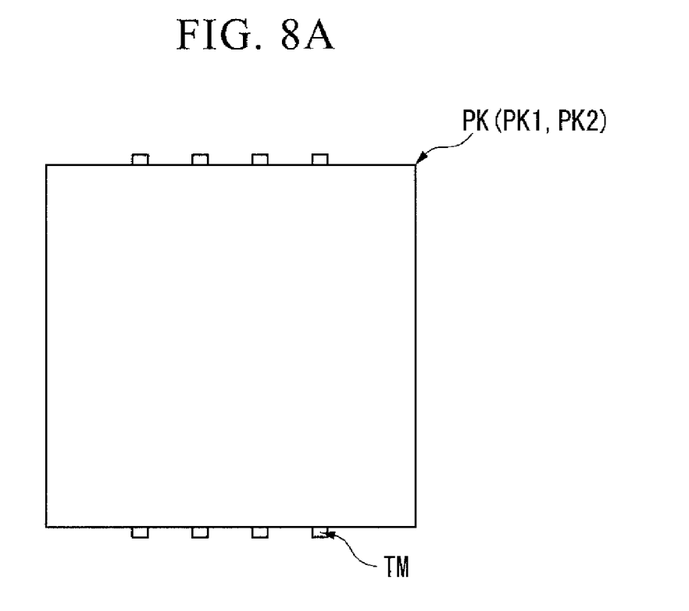
FIG. 8A is a bottom view illustrating an entire configuration of a light-emitting element package.
Figure 8B:
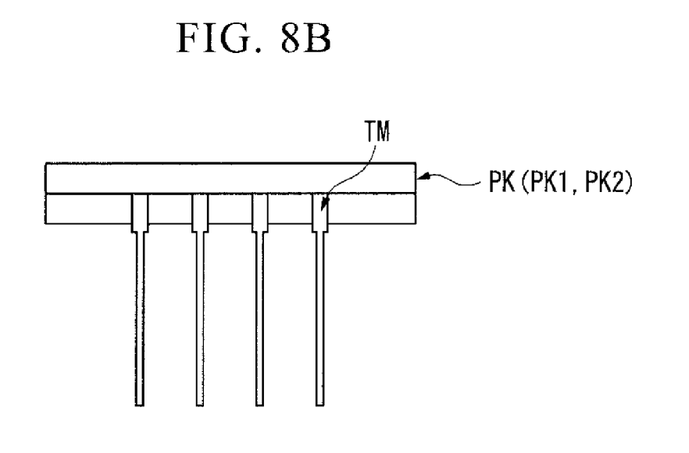
FIG. 8B is a side view illustrating the entire configuration of the light-emitting element package.

FIGS. 8A and 8B are diagrams illustrating a configuration example of a light-emitting element package PK. FIG. 8A is a bottom view of the light-emitting element package PK and FIG. 8B is a side view of the light-emitting element package PK. As shown in FIGS. 8A and 8B, the terminals TM are arranged, for example, on two side surfaces parallel to each other out of the side surfaces of the light-emitting element package PK. The plural terminals TM are arranged with a regular pitch on each side surface.

Figure 9A:
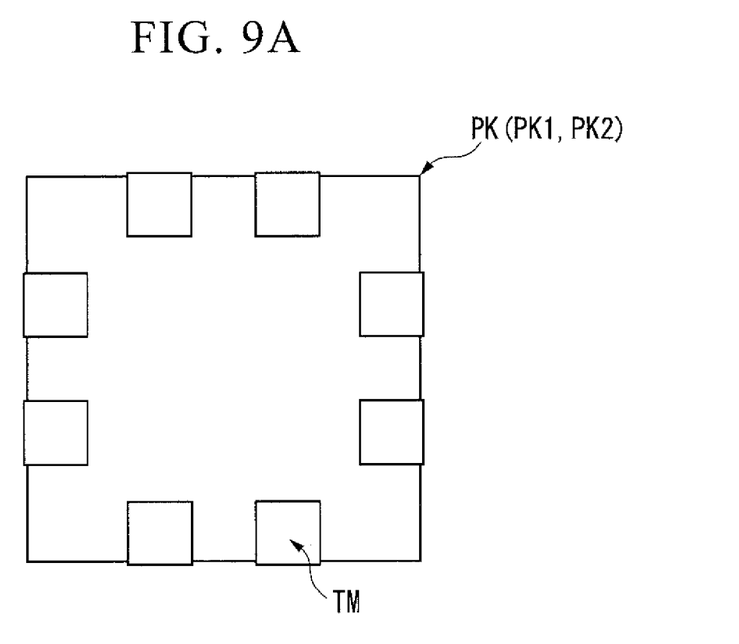
FIG. 9A is a bottom view illustrating the entire configuration of a light-emitting element package.
Figure 9B:
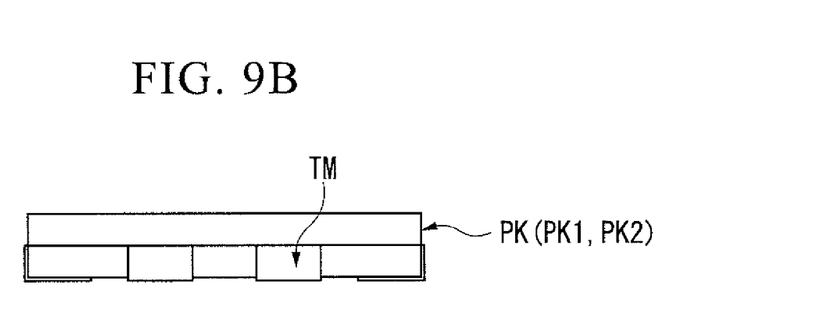
FIG. 9B is a side view illustrating the entire configuration of the light-emitting element package.

FIGS. 9A and 9B are diagrams illustrating another configuration example of a light-emitting element package PK. FIG. 9A is a bottom view of the light-emitting element package PK and FIG. 9B is a side view of the light-emitting element package PK. As shown in FIGS. 9A and 9B, two terminals TM are arranged on each of four side surfaces of the light-emitting element package PK. Each terminal TM is formed from the side surface to the bottom surface so as to cover the corresponding edge.

Figure 10A:
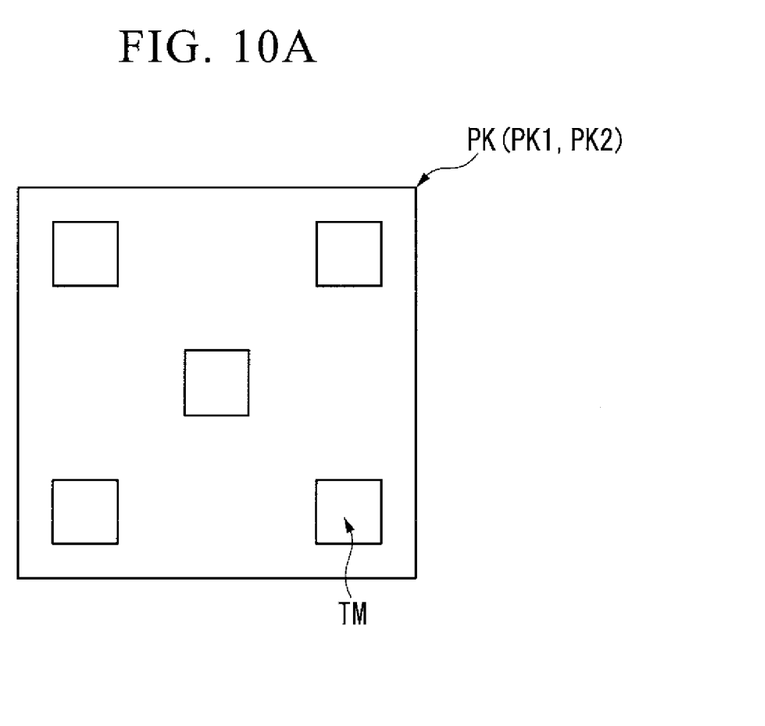
FIG. 10A is a bottom view illustrating the entire configuration of a light-emitting element package.
Figure 10B:
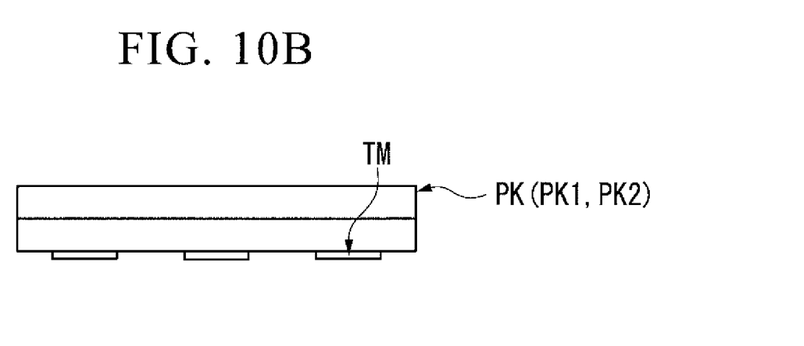
FIG. 10B is a side view illustrating the entire configuration of the light-emitting element package.

FIGS. 10A and 10B are diagrams illustrating another configuration example of a light-emitting element package PK. FIG. 10A is a bottom view of the light-emitting element package PK and FIG. 10B is a side view of the light-emitting element package PK. As shown in FIGS. 10A and 10B, the terminals TM are arranged, for example, at five positions on the bottom surface of the light-emitting element package PK.

The technical scope of the present invention is not limited to the above-mentioned embodiments, and the embodiments can be modified in appropriate forms without departing from the concept of the present invention.

For example, it is described in the above-mentioned embodiments that LEDs are described as an example of the light-emitting elements D, but the present invention is not limited to this configuration and other light-emitting elements may be used.

Additionally, for example, it is described in the above-mentioned embodiments that three or four light-emitting elements D are arranged on a single light-emitting element package, but the present invention is not limited to this configuration and a configuration in which two or five or more light-emitting elements D are arranged in a single light-emitting element package may be employed.

Additionally, it is described in the above-mentioned embodiments that the light-emitting element packages are individually treated, but the present invention is not limited to this configuration and for example, a configuration in which a plate-like member PS having plural light-emitting element packages arranged thereon is partitioned into plural blocks and the blocks are independently treated may be employed. In this case, since the plural light-emitting element packages can be treated collectively the handling property is improved.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A light-emitting element package comprising:
a plurality of substrates, and
a plurality of light-emitting elements disposed on each of the plurality of substrates,
wherein the plurality of light-emitting elements are arranged on each substrate so that an arrangement of the plurality of light-emitting elements on each substrate becomes same in an arrangement state in which the plurality of substrates are arranged with a regular pitch along a first direction and a second direction which are directions perpendicular to a thickness direction of the substrates,
wherein the plurality of light-emitting elements are arranged on each substrate so that a pitch of the plurality of light-emitting elements on each substrate is equal to a pitch of the plurality of light-emitting elements between neighboring substrates in the arrangement state of the substrates,
wherein each substrate has a rectangular shape,
each of the plurality of light-emitting elements comprises a first light-emitting element, a second light-emitting element, and a third light-emitting element,
the first light-emitting element and the third light-emitting element are disposed along a third side out of a first side and a second side parallel to the first direction and the third side and a fourth side parallel to the second direction, which are four sides of the substrate,
the first light-emitting element is disposed to be close to the first side and the third light-emitting element is disposed to be close to the second side,
the second light-emitting element is disposed at a position along the fourth side,
the substrate is disposed so that bearings in the first direction or the second direction of the substrates neighboring in the first direction and the second direction are different from each other by 180°,
a size of the first light-emitting element in the first direction is defined as A11 and a size thereof in the second direction is defined as A12,
a size of the second light-emitting element in the first direction is defined as A21 and a size thereof in the second direction is defined as A22,
a size of the third light-emitting element in the first direction is defined as A31 and a size thereof in the second direction is defined as A32,
a distance between a first emission center which is a center of light emission of the first light-emitting element and a second emission center which is a center of light emission of the second light-emitting element in the first direction is defined as B1,
a distance between the second emission center and a third emission center which is a center of light emission of the third light-emitting element in the first direction is defined as B2,
a distance between the third emission center and the first emission center in the second direction is defined as B3,
a distance between the first emission center and the first side is defined as b1,
a distance between the second emission center and the first side is defined as b2,
a distance between the second emission center and the fourth side is defined as b3,
a distance between the second emission center and the second side is defined as b4,
a distance between the third emission center and the second side is defined as b5,
a distance between the third emission center and the third side is defined as b6,
a distance between the first emission center and the third side is defined as b7,
a size of the substrate in the first direction is defined as C1,
a size of the substrate in the second direction is defined as C2,
a distance between neighboring substrates in the first direction is defined as $\alpha$,
a distance between neighboring substrates in the second direction is defined as $\beta$,
a distance between the first emission center to a first edge of the first light-emitting element in the first direction is defined as V11,
a distance between the first emission center to a second edge of the first light-emitting element in the second direction is defined as V12,
a distance between the second emission center to an edge of the second-light emitting element in the first direction is defined as V21,
a distance between the third emission center to an edge of the third-light emitting element in the second direction is defined as V32, and $$C1=B1+b3+b7=2\times B1-\alpha \text{ and}$$

$$C2=B3+b1+b5=2\times B3-\beta$$

are satisfied when $$V11+V21<B1 \text{ and}$$

$$V12+V32<B3$$

are satisfied.

2. The light-emitting element package according to claim 1, wherein $B1=B2=(\sqrt{3}/2)\times B3$ is further satisfied.

3. The light-emitting element package according to claim 2, wherein $C1=C2$ is further satisfied.

4. A light-emitting element package comprising:
a plurality of substrates, and
a plurality of light-emitting elements disposed on each of the plurality of substrates,
wherein the plurality of light-emitting elements are arranged on each substrate so that an arrangement of the plurality of light-emitting elements on each substrate becomes same in an arrangement state in which the plurality of substrates are arranged with a regular pitch along a first direction and a second direction which are directions perpendicular to a thickness direction of the substrates, and
wherein the plurality of light-emitting elements are arranged on each substrate so that a pitch of the plurality of light-emitting elements on each substrate is equal to a pitch of the plurality of light-emitting elements between neighboring substrates in the arrangement state of the substrates,
wherein each substrate has a rectangular shape,
each of the plurality of light-emitting elements comprises a first light-emitting element, a second light-emitting element, a third light-emitting element, and a fourth light-emitting element,
the first light-emitting element and the fourth light-emitting element are disposed along a third side out of a first side and a second side parallel to the first direction and the third side and a fourth side parallel to the second direction, which are four sides of the substrate,
the second light-emitting element and the third light-emitting element are arranged along the fourth side,
the first light-emitting element and the second light-emitting element are disposed to be close to the first side,
the third light-emitting element and the fourth light-emitting element are disposed to be close to the second side,
a size of the first light-emitting element in the first direction is defined as L11 and a size thereof in the second direction is defined as L12,
a size of the second light-emitting element in the first direction is defined as L21 and a size thereof in the second direction is defined as L22,
a size of the third light-emitting element in the first direction is defined as L31 and a size thereof in the second direction is defined as L32,
a size of the fourth light-emitting element in the first direction is defined as L41 and a size thereof in the second direction is defined as L42,
a distance between a first emission center which is a center of light emission of the first light-emitting element and a second emission center which is a center of light emission of the second light-emitting element in the first direction is defined as M1,
a distance between the second emission center and a third emission center which is a center of light emission of the third light-emitting element in the first direction is defined as M2,
a distance between the third emission center and a fourth emission center which is a center of light emission of the fourth light-emitting element in the first direction is defined as M3,
a distance between the fourth emission center and the first emission center in the first direction is defined as M4,
a distance between the first emission center and the first side is defined as m1,
a distance between the second emission center and the first side is defined as m2,
a distance between the second emission center and the fourth side is defined as m3,
a distance between the third emission center and the fourth side is defined as m4,
a distance between the third emission center and the second side is defined as m5,
a distance between the fourth emission center and the second side is defined as m6,
a distance between the fourth emission center and the third side is defined as m7,
a distance between the first emission center and the third side is defined as m8,
a size of the substrate in the first direction is defined as N1,
a size of the substrate in the second direction is defined as N2,
a distance between neighboring substrates in the first direction is defined as α,
a distance between neighboring substrates in the second direction is defined as β,
a distance between the first emission center to a first edge of the first light-emitting element in the first direction is defined as W11,
a distance between the first emission center to a second edge of the first light-emitting element in the second direction is defined as W12,
a distance between the second emission center to an edge of the second-light emitting element in the first direction is defined as W21,
a distance between the fourth emission center to an edge of the fourth-light emitting element in the second direction is defined as W42, and $$N1 = M1 + m3 + m8 = 2 \times M1 - \alpha \text{ and}$$

$$N2 = M4 + m1 + m6 = 2 \times M4 - \beta$$

are satisfied when $$W11 + W21 < M1 \text{ and}$$

$$W12 + W42 < M4$$

are satisfied.

5. The light-emitting element package according to claim 4, wherein M1=M2=M3=M4 is further satisfied.

6. The light-emitting element package according to claim 5, wherein N1=N2 is further satisfied.

7. A display device comprising:
a display panel in which a plurality of the light-emitting element packages according to claim 3 is arranged with a regular pitch in the first direction and the second direction, and
a controller that displays a pixel by combining some light-emitting elements of each light-emitting element package out of the plurality of light-emitting elements of the neighboring light-emitting element packages.

8. A display device comprising:
a display panel in which a plurality of the light-emitting element packages according to claim 6 is arranged with a regular pitch in the first direction and the second direction, and
a controller that displays a pixel by combining some light-emitting elements of each light-emitting element package out of the plurality of light-emitting elements of the neighboring light-emitting element packages.

9. A display device comprising:
a display panel in which a plurality of the light-emitting element packages according to claim 1 are arranged with a regular pitch in the first direction and the second direction, and a controller that displays a pixel by combining some light-emitting elements of each light-emitting package out of the plurality of light-emitting elements of the neighboring light-emitting element packages.

10. A display device comprising:
a display panel in which a plurality of the light-emitting element packages according to claim 4 are arranged with a regular pitch in the first direction and the second direction, and
a controller that displays a pixel by combining some light-emitting elements of each light-emitting package out of the plurality of light-emitting elements of the neighboring light-emitting element packages.

* * * * *